US006281084B1

(12) United States Patent
Akatsu et al.

(10) Patent No.: US 6,281,084 B1
(45) Date of Patent: Aug. 28, 2001

(54) DISPOSABLE SPACERS FOR IMPROVED ARRAY GAPFILL IN HIGH DENSITY DRAMS

(75) Inventors: Hiroyuki Akatsu, Yorktown Heights; Ramachandra Divakaruni, Middletown; Gill Yong Lee, Wappingers Falls, all of NY (US)

(73) Assignees: Infineon Technologies Corporation, Cupertino, CA (US); International Business Machines Corp., Armonk, NY (US); Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/386,832

(22) Filed: Aug. 31, 1999

(51) Int. Cl.[7] .................................................. H01L 21/336
(52) U.S. Cl. ........................... 438/301; 438/303; 438/305
(58) Field of Search ................................... 438/301, 595, 438/304, 305, 303, 267

(56) References Cited

U.S. PATENT DOCUMENTS

| 4,729,006 | | 3/1988 | Dally et al. . | |
|---|---|---|---|---|
| 4,784,965 | * | 11/1988 | Woo et al. ............................... | 437/30 |
| 5,371,026 | * | 12/1994 | Hayden et al. .......................... | 437/41 |
| 5,496,771 | * | 3/1996 | Cronin et al. .......................... | 437/187 |
| 5,573,964 | | 11/1996 | Hsu et al. . | |
| 5,591,650 | * | 1/1997 | Hsu et al. ............................... | 437/21 |
| 5,663,578 | | 9/1997 | Hsu et al. . | |
| 5,668,065 | | 9/1997 | Lin . | |
| 5,686,331 | * | 11/1997 | Song ....................................... | 437/41 |
| 5,696,016 | | 12/1997 | Chen et al. . | |
| 5,719,425 | * | 2/1998 | Akram et al. .......................... | 257/344 |
| 5,739,066 | * | 4/1998 | Pan ........................................ | 438/595 |
| 5,747,373 | | 5/1998 | Yu . | |
| 5,770,506 | * | 6/1998 | Koh ....................................... | 438/303 |
| 5,780,350 | * | 7/1998 | Kapoor .................................. | 438/305 |
| 5,783,475 | * | 7/1998 | Ramaswami .......................... | 438/303 |
| 5,804,856 | * | 9/1998 | Ju .......................................... | 257/344 |
| 5,830,798 | * | 11/1998 | Dennison et al. ..................... | 438/297 |
| 5,877,058 | * | 3/1999 | Gardner et al. ....................... | 438/304 |
| 5,925,918 | * | 7/1999 | Wu et al. ............................... | 257/413 |
| 5,998,290 | * | 12/1999 | Wu et al. ............................... | 438/595 |
| 6,037,639 | * | 3/2000 | Ahmad ................................. | 257/401 |
| 6,049,114 | * | 4/2000 | Maiti et al. ........................... | 257/412 |
| 6,133,098 | * | 10/2000 | Ogura et al. .......................... | 438/267 |

FOREIGN PATENT DOCUMENTS 4-245441   2/1992   (JP) .
6-104276   4/1994   (JP) .

OTHER PUBLICATIONS

Ronkainen et al, "The Use of Disposable Double Spacer and Self–Aligned Cobalt Silicide for LDD MOSFET Fabrication" IEEE Electron Device Letters, pp. 125–127, Mar. 1, 1991.*

* cited by examiner

Primary Examiner—John F. Niebling
Assistant Examiner—Walter L. Lindsay, Jr.
(74) Attorney, Agent, or Firm—Wood, Phillips, VanSanten, Clark & Mortimer

(57) ABSTRACT

There is disclosed the process of forming a gate conductor for a semiconductor device. The process begins with the step of providing a semiconductor substrate having a gate stack formed thereon, the gate stack including a sidewall. Dielectric spacers are formed on the gate conductor sidewalls, the dielectric spacers comprising an inner spacer and an outer spacer, the outer spacer being of a doped glass material. Ions are implanted into the semiconductor substrate outwardly of the dielectric spacers. The outer spacers are then removed.

20 Claims, 3 Drawing Sheets

DISPOSABLE SPACERS FOR IMPROVED ARRAY GAPFILL IN HIGH DENSITY DRAMS

FIELD OF THE INVENTION

This invention relates to a process of forming semiconductor devices and, more particularly, to modified gate conductor processing using disposable doped glass spacers for improved array gapfill in high density dynamic random access memories or embedded memories.

BACKGROUND OF THE INVENTION

The channel length of the dynamic random access memory (DRAM) transfer gate device continues to shrink aggressively. Conventional scaling techniques are limited in their applicability for the low leakage DRAM transfer device.

The present processing of DRAM structures in an array uses nitride spacers in a gate stack to provide margin for the borderless contacts. These same spacers in the support devices increase the distance of the P-FET extension and halo implants from gate polysilicon.

The top of the gate stack is more severely exposed to the borderless contact etch. Therefore, for improved borderless contact margin it is preferable to have a thicker borderless contact barrier at the top compared to the bottom. Divakaruni et al., U.S. patent application Ser. No. 09/325,942, filed Jun. 4, 1999 entitled "Modified Gate Conductor Processing for Poly Length Control In High Density DRAMs" describes a stack formed with tungsten silicide enclosed by nitride spacers before sidewall oxidation. The presence of these spacers ameliorates the need for additional large spacers in the array for borderless contact margin. However, the support P-FETs still need an offset from the support N-FETs for the extension and the halo implants. This offset currently is about 30 nm and the use of nitride spacers in the array at these dimensions uses up valuable space between the tightly packed gates and causes severe constraints for void free gapfill at low temperatures.

The present invention is directed to overcoming the problems discussed above in a novel and simple manner.

SUMMARY OF THE INVENTION

In accordance with the invention, a method utilizes disposable spacers to achieve improved gapfil in an array. The spacers define an offset between N-FET and P-FET extension and halo implants and are then removed.

Broadly, there is disclosed herein the process of forming a gate conductor for a semiconductor device. The process comprises the steps of providing a semiconductor substrate having a gate stack formed thereon, the gate stack including a sidewall. Dielectric spacers are formed on the gate conductor sidewalls, the dielectric spacers comprising an inner spacer and an outer spacer, the outer spacer being of a disposable material, such as doped glass or TEOS. Ions are implanted into the semiconductor substrate outwardly of the dielectric spacers. The outer spacers are then removed.

It is a feature of the invention that thickness of the outer spacer is greater than the inner spacer.

It is another feature of the invention that the outer spacer is selected from a group consisting of BSG, PSG, BPSG, FSG, F-BSG, ASG and TEOS.

It is a further feature of the invention that the forming step comprises depositing a first layer of dielectric material, typically SiN, over the semiconductor substrate and the gate stack, and then depositing a second layer of doped glass over the first layer. The dielectric material is selected from a group consisting of nitride and oxide. The forming step further comprises the step of etching horizontal surfaces of the first and second layers to form the dielectric spacers.

There is disclosed in accordance with another aspect of the invention the process of forming a gate conductor for a semiconductor device. The process comprises the steps of providing a semiconductor substrate having an oxide layer and a gate stack formed thereon. The gate stack includes a layer of polysilicon on the oxide layer, a conductor material layer on the polysilicon layer, and a nitride cap layer on the conductor material layer. A nitride prespacer surrounds at least part of the stack to define a gate conductor sidewall. Dielectric spacers are formed on the gate conductor sidewalls. The dielectric spacers comprise an inner spacer and an outer spacer. The outer spacer is of doped glass or TEOS material. Ions are implanted into the semiconductor substrate outwardly of the dielectric spacers. The outer spacer is then removed. Note that the inner spacer may then be etched and additional implants performed if necessary.

Further features and advantages of the invention will be readily apparent from the specification and from the drawing.

DETAILED DESCRIPTION OF THE INVENTION

The use of disposable spacers for improved array gapfill in high density dynamic random access memories (DRAMs) or embedded memories is illustrated. The spacers are used to define the offsets between the N-FET and P-FET extension and halo implants, and they are then removed. Note that the disposable spacers may also be used to implant the source/drain implants, strip the spacer, etch the inner spacers and then perform the extension implants.

Figure 1:
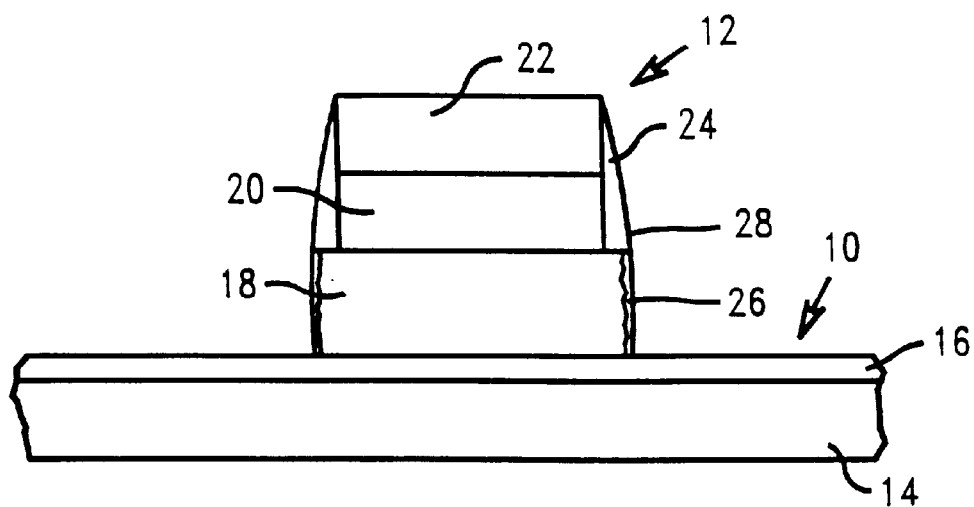
FIGS. 1–5 are a series of cross-sections illustrating a process of forming a semiconductor device in accordance with the invention.

Referring initially to FIG. 1, a process described in Divakaruni et al., pending application Ser. No. 09/325,942, discussed above, is used initially for forming a semiconductor device 10 including a gate stack 12. This process is described in connection with a trench DRAM cell with self-aligned BuriEd STrap (BEST) cells. The trench capacitor and shallow trench isolation is formed in a semiconductor substrate 14. An oxide layer 16 is grown on the substrate 14. The formed gate stack 12 includes a polysilicon layer 18 on the oxide layer 16, a gate conductor material layer 20 on the polysilicon layer 18, and a nitride cap layer 22 on the gate conductor material layer 20. A nitride prespacer 24 is formed surrounding the gate conductor material layer 20 and nitride layer 22. The exposed polysilicon in the layer 18 is oxidized as shown at 26. The prespacer 24 and exposed polysilicon which has been oxidized as at 26 define a gate conductor side wall 28.

After the gate sidewall oxidation, an n-type implant in the array and a higher dose n-type implant for the support N-FET is performed in a conventional manner and is not specifically illustrated herein. A thin barrier layer 30 of dielectric material is deposited over the semiconductor device 10. Particularly, the layer 30 is deposited over the semiconductor substrate oxide layer 16 and the gate stack 12. The dielectric material used in the layer 30 may consist of nitride or oxide. The layer 30 may have a thickness on the order of ten nm.

Figure 2:
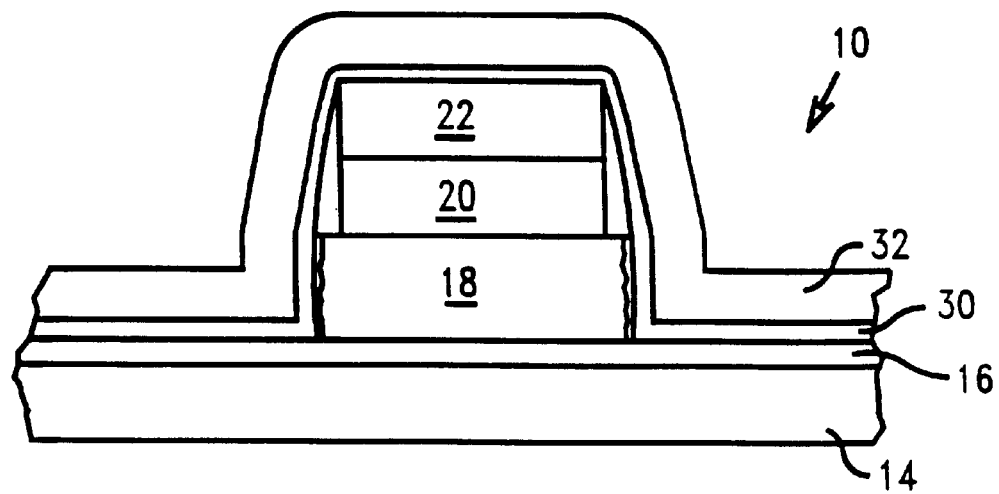

A second layer 32 of a dielectric material is then formed on the first layer 30. The resulting structure is illustrated in FIG. 2 The thickness of the second layer 32 may be on the order of, for example, twenty nm. In accordance with the invention, the second layer 32 comprises a doped glass such as borosilicate glass (BSG) or TEOS. Alternatively, the doped glass may consist of phosphosilicate glass (PSG). PSG may be advantageous, as it has higher wet etch rates than BSG. PSG is also a more stable material than BSG, which usually has very high moisture absorption properties. This enables increasing dopant concentration while maintaining stable film properties. Additionally, the doped glass might also consist of other doping materials such as BPGS, FSG, F-BSG, ASG, TEOS or others.

Figure 3:
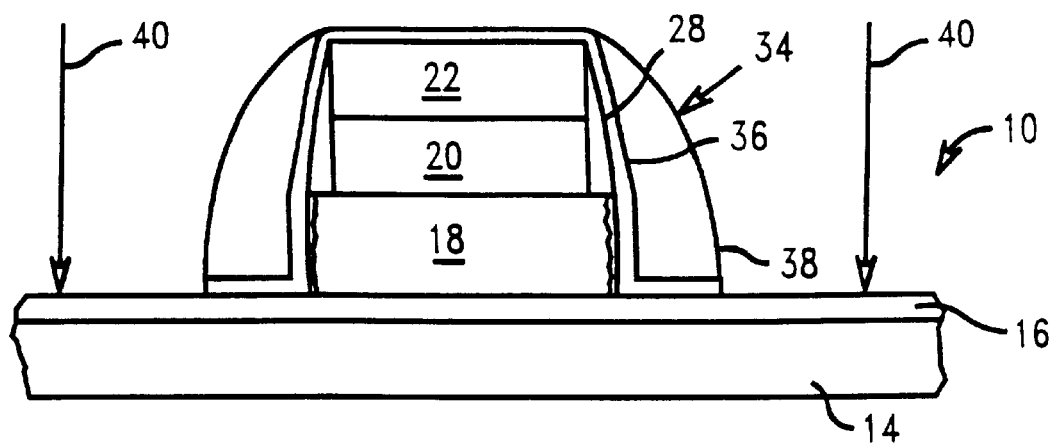

After the first and second layers 30 and 32 are deposited, horizontal surfaces are etched to form dielectric spacers 34, as shown in FIG. 3. Particularly, the doped glass layer 32 is etched through the nitride layer 30 and stopping selectively at the gate oxide layer 16. The dielectric spacer 34 thus includes an inner spacer 36 and an outer spacer 38, the outer spacer 38 being of the doped glass material.

Note that if the disposable spacer is thicker, say from 40 nm to 100 nm, then the highly doped source-drain junctions may be implanted first, the outer spacers stripped, the inner dielectric etched to form spacers and the p-type extension and halo implants performed. All of these steps may be performed with a resist mask in place, thus saving the cost of an additional masking step.

Figure 4:
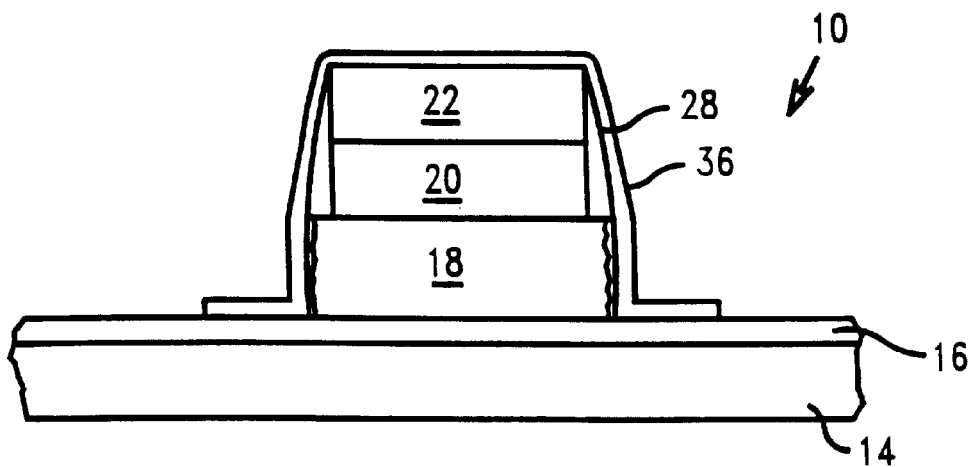

Subsequent to formation of the dielectric spacer 34, a masked p-type implant is done, represented by arrows 40, which blocks the N-FETs and places the extension and halo implants the requisite distance from the gate polysilicon layer 18. Thereafter, the doped glass outer spacer 38 is stripped from the wafer using material which is selective to nitride and oxide. This may be done with a known wet etch such as HF/sulfuric or HF vapor or other HF-based wet etches. The resulting structure is illustrated in FIG. 4. Thereafter, a second barrier layer 42, see FIG. 5, of dielectric material, typically a nitride layer, is deposited over the semiconductor device 10. The second barrier layer 42 may be of a different material from the spacer barrier layer 36. Typically, fluorine from $BF_2$ of the p-type implant limits the choice of the barrier nitride. In this instance, oxynitride could be used for the first barrier layer 36 and plasma enhanced SiN for the second barrier layer 42. Subsequent processing may be conventional in nature.

Figure 5:
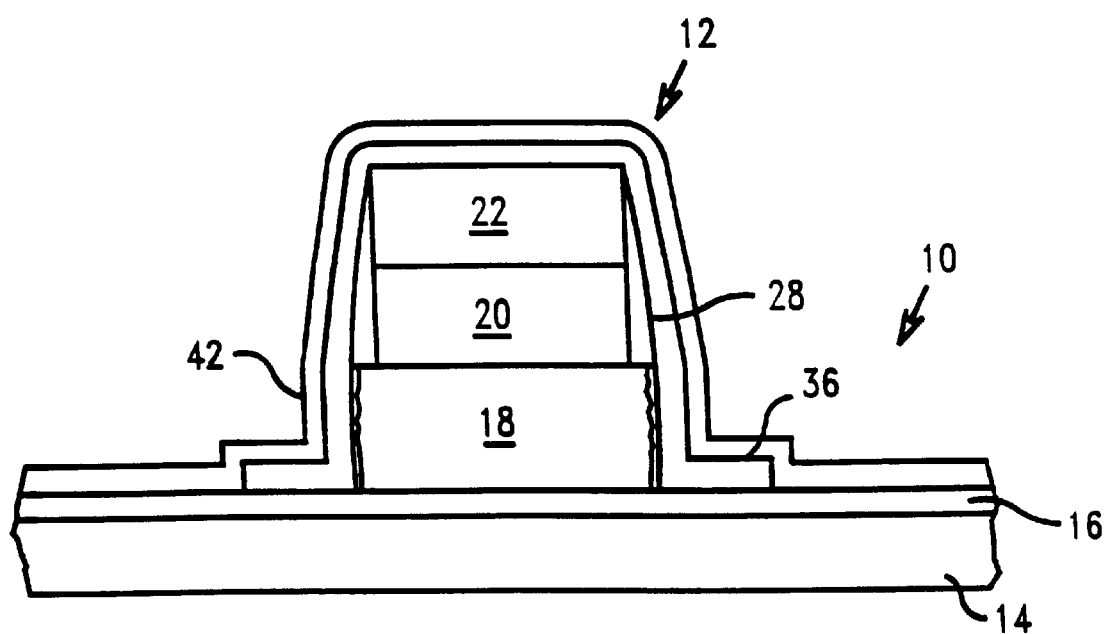

As illustrated in FIG. 5, the offset in nitride thickness between the planer and sidewall layers exists even at the bottom of the gate conductor stack 12 to provide good margin for the borderless contact etch to follow.

The described process reduces nitride thickness in a DRAM structure from the top of the gate stack 12 to the bottom by using the disposable doped glass spacers. This structure helps to improve gapfill characteristics of the array which allows reduction in the thermal budget required for the process.

Thus, in accordance with the invention, modified gate conductor processing uses disposable doped glass spacers for improved array gapfill in high density DRAMS or embedded memories.

Note that for a given gate conductor pitch in the array, this invention allows for smaller lines and improved gapfill without compromising transfer gate off state leakage characteristics.

We claim:
1. The process of forming gate conductors for improved gapfill in a high density semiconductor memory device comprising the steps of:
   providing a semiconductor substrate having an array region and a support region, each including gates stacks formed thereon, each gate stack including a sidewall;
   forming dielectric spacers on the gate conductor sidewalls, the dielectric spacers comprising an inner spacer and an outer spacer, the outer spacer defining an offset in the support region;
   implanting ions into the semiconductor substrate outwardly of the dielectric spacers; and
   removing the outer spacer for improved array gapfill characteristics.
2. The process of claim 1 wherein the outer spacer is of a doped glass material.
3. The process of claim 1 wherein thickness of the outer spacer is greater than the inner spacer.
4. The process of claim 1 wherein the outer spacer is selected from a group consisting of BSG, PSG, BPSG, FSG, F-BSG, ASG and TEOS.
5. The process of claim 1 wherein the forming step comprises depositing a first layer of dielectric material over the semiconductor substrate and the gate stack and then depositing a second layer of doped glass or TEOS over the first layer.
6. The process of claim 5 wherein the dielectric material is selected from a group consisting of nitride and oxide.
7. The process of claim 5 wherein the forming step further comprises the step of etching horizontal surfaces of the first and second layers to form the dielectric spacers.
8. The process of claim 1 further comprising the step of depositing a barrier layer over the gate conductor stack and the semiconductor substrate following the removing step.
9. The process of claim 8 wherein the barrier layer comprises a nitride layer.
10. The process of claim 8 wherein the inner spacer is formed of oxynitride and the barrier layer is formed of plasma enhanced SiN.
11. The process of forming gate conductors for improved gapfill in a high density semiconductor memory device comprising the steps of:
   providing a semiconductor substrate having an oxide layer, defining an array region and a support region, and having gate stacks formed thereon each gate stack including a layer of polysilicon on the oxide layer, a conductor material layer on the polysilicon layer and a nitrite cap layer on the conductor material layer, and a nitrite prespacer surrounding at least part of the gate stack to define a gate conductor sidewall;
   forming dielectric spacers on the gate conductor sidewalls, the dielectric spacers comprising an inner spacer and an outer spacer, the outer spacer defining an offset in the support region;
   implanting ions into the semiconductor substrate outwardly of the dielectric spacers; and
   removing the outer spacers for improved array gapfill characteristics.
12. The process of claim 11 wherein the outer spacer is of a doped glass material.
13. The process of claim 11 wherein thickness of the outer spacer is greater than the inner spacer.
14. The process of claim 11 wherein the outer spacer is selected from a group consisting of BSG, PSG, BPSG, FSG, F-BSG, ASG, and TEOS.

15. The process of claim 11 wherein the forming step comprises depositing a first layer of dielectric material over the semiconductor substrate and the gate stack and then depositing a second layer of doped glass or TEOS over the first layer.

16. The process of claim 15 wherein the dielectric material is selected from a group consisting of nitride and oxide.

17. The process of claim 15 wherein the forming step further comprises the step of etching horizontal surfaces of the first and second layers to form the dielectric spacers.

18. The process of claim 11 further comprising the step of depositing a barrier layer over the gate conductor stack and the semiconductor substrate following the removing step.

19. The process of claim 18 wherein the barrier layer comprises a nitride layer.

20. The process of claim 18 wherein the inner spacer is formed of oxynitride and the barrier layer is formed of plasma enhanced SiN.

* * * * *